United States Patent
Oh et al.

(10) Patent No.: US 10,121,988 B2
(45) Date of Patent: Nov. 6, 2018

(54) FLEXIBLE DISPLAY DEVICE

(71) Applicant: SAMSUNG DISPLAY CO., LTD., Yongin-si, Gyeonggi-do (KR)

(72) Inventors: Soohee Oh, Yongin-si (KR); Hyunggyu Park, Yongin-si (KR); Seonggeun Won, Yongin-si (KR); Hirotsugu Kishimoto, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/238,582

(22) Filed: Aug. 16, 2016

(65) Prior Publication Data

US 2017/0162821 A1   Jun. 8, 2017

(30) Foreign Application Priority Data

Dec. 2, 2015  (KR) .......................... 10-2015-0170659

(51) Int. Cl.
| | |
|---|---|
| *H01L 51/52* | (2006.01) |
| *G06F 1/16* | (2006.01) |
| *G02F 1/1333* | (2006.01) |
| *H01L 27/32* | (2006.01) |

(Continued)

(52) U.S. Cl.
CPC .... *H01L 51/5237* (2013.01); *G02F 1/133305* (2013.01); *G06F 1/1652* (2013.01); *H01L 27/323* (2013.01); *H01L 27/3244* (2013.01); *H01L 51/0097* (2013.01);

(Continued)

(58) Field of Classification Search
CPC ............. H01L 51/0097; H01L 51/5237; H01L 2251/5338; H01L 27/3244; H01L 27/323; H01L 27/3248; H01L 27/3279; H01L 27/3276; G06F 1/1652; G02F 1/133305;
(Continued)

(56) References Cited

U.S. PATENT DOCUMENTS 9,379,355 B1 * 6/2016 Lee ...................... H01L 51/5253
9,430,180 B2 * 8/2016 Hirakata ............... G06F 3/1446
(Continued)

FOREIGN PATENT DOCUMENTS

KR    10-2006-0125326 A    12/2006
KR    10-2014-0064156 A    5/2014
(Continued)

*Primary Examiner* — Michael Trinh
(74) *Attorney, Agent, or Firm* — Lewis Roca Rothgerber Christie LLP (57) ABSTRACT

A flexible display apparatus includes a flexible display panel which includes a flexible display substrate having an active area and an inactive area outside the active area. The inactive area which extends from the active layer and includes a bending area foldable or adapted to be folded in a first direction. The bending area includes a deformation unit that includes a plurality of unit deformable portions such that the flexible display panel is foldable or adapted to be folded in a second direction. The flexible display substrate may include an encapsulation layer on the flexible display substrate. The flexible display apparatus may include a functional layer on a side of the flexible display panel. A folded end portion of the flexible display panel may be on the functional layer. The flexible display apparatus may also include a driving unit.

18 Claims, 9 Drawing Sheets

(51) Int. Cl.
*H05K 1/02* (2006.01)
*H01L 51/00* (2006.01)
(52) U.S. Cl.
CPC ...... *H01L 51/5253* (2013.01); *H01L 51/5281* (2013.01); *H05K 1/028* (2013.01); *H01L 2251/5338* (2013.01)
(58) Field of Classification Search
CPC .......... G02F 1/13452; G02F 1/133308; H05K 1/028; H05K 1/0283
See application file for complete search history.

(56) References Cited

U.S. PATENT DOCUMENTS

| | | | | |
|---|---|---|---|---|
| 2007/0216670 | A1* | 9/2007 | Yatsu | G09G 3/006 345/205 |
| 2014/0152646 | A1* | 6/2014 | Kang | G09G 3/2085 345/214 |
| 2014/0226275 | A1* | 8/2014 | Ko | G06F 1/1626 361/679.27 |
| 2014/0252944 | A1* | 9/2014 | Lee | H01L 51/5096 313/504 |
| 2014/0306941 | A1 | 10/2014 | Kim et al. | |
| 2015/0208522 | A1 | 7/2015 | Kim et al. | |

FOREIGN PATENT DOCUMENTS

| | | |
|---|---|---|
| KR | 10-2014-0118222 A | 10/2014 |
| KR | 10-2015-0087706 A | 7/2015 |

\* cited by examiner

FLEXIBLE DISPLAY DEVICE

CROSS-REFERENCE TO RELATED APPLICATION

This application claims priority to and the benefit of Korean Patent Application No. 10-2015-0170659, filed on Dec. 2, 2015, in the Korean Intellectual Property Office, the disclosure of which is incorporated herein in its entirety by reference.

BACKGROUND

1. Field

One or more embodiments relate to a flexible display apparatus.

2. Description of the Related Art

Generally, a display apparatus may be usable in a mobile apparatus, such as a smart phone, a laptop computer, a digital camera, a camcorder, a portable information terminal, a notebook, and a tablet personal computer (PC), or an electronic apparatus, such as a desktop computer, a television, a billboard, and an exhibit display apparatus.

Recently, more slim display apparatuses have been released in the market.

Flexible display apparatuses are portable and may be usable in various apparatuses.

SUMMARY

One or more embodiments include a flexible display apparatus with improved bending characteristics.

Additional aspects will be set forth in part in the description which follows and, in part, will be apparent from the description, or may be learned by practice of one or more of the presented embodiments.

According to one or more embodiments, a flexible display apparatus includes a flexible display panel which includes a flexible display substrate. The flexible display substrate has or includes an active area and an inactive area outside the active area. The inactive area extends from the active area and includes a bending area to be folded (e.g., foldable or bendable) in a first direction. The flexible display panel includes an encapsulation layer arranged on the flexible display substrate, and the flexible display apparatus includes a functional layer on a side of the flexible display panel and on which a folded end portion of the flexible display panel is arranged, and a driving unit (e.g., driver) electrically connected to the flexible display panel, wherein the bending area includes a deformation unit having a plurality of unit deformable portions such that the flexible display panel is foldable or adapted to be folded in a second direction.

According to one or more embodiments, the first direction may be a horizontal direction of the flexible display panel, and the second direction may be a vertical direction of the flexible display panel.

According to one or more embodiments, the deformation unit may be arranged along an edge portion of the flexible display substrate and may include at least a cut-out portion of the bending area.

According to one or more embodiments, the plurality of unit deformable portions may correspond to or be configured as a plurality of wing portions which are arranged along the edge portion of the flexible display substrate.

According to one or more embodiments, the unit deformable portions may include a bottom portion which is positioned to contact the edge portion of the flexible display substrate, a top portion which is positioned away from the edge portion of the flexible display substrate, and a side portion which connects the bottom portion to the top portion. The bottom portion, the top portion, and the side portion may correspond to a three-cut portion of the bending area in which three areas of the bending area corresponding to the bottom portion, the top portion, and the side portion are cut out.

According to one or more embodiments, the unit deformable portions may become narrower as a distance from the bottom portion contacting the edge portion of the flexible display substrate increases.

According to one or more embodiments, a first bending line may extend partially or completely along a boundary between the edge portion of the flexible display substrate and the deformation unit such that the flexible display panel is foldable or adapted to be folded in the first direction of the flexible display panel about the first bending line.

According to one or more embodiments, a second bending line may be between one or more adjacent unit deformable portions of the plurality of unit deformable portions and cross the flexible display panel such that the flexible display panel is foldable or adapted to be folded in the second direction about the second bending line.

According to one or more embodiments, the flexible display panel may be foldable or adapted to be folded about the first bending line and may be additionally foldable or adapted to be folded about the second bending line in a direction perpendicular to a folding direction in which the flexible display panel is foldable or adapted to be folded about the first bending line.

According to one or more embodiments, the plurality of unit deformable portions may be arranged along the edge portion of the flexible display substrate and may be spaced apart from each other.

According to one or more embodiments, an interval between one or more adjacent unit deformable portions of the plurality of unit deformable portions may be uniform or non-uniform. The respective shapes of the unit deformable portions may be the same or different from each other.

According to one or more embodiments, at least portions of one or more adjacent unit deformable portions of the plurality of unit deformable portions may contact each other.

According to one or more embodiments, the plurality of unit deformable portions may be a plurality of holes which are arranged in the bending area extended along the edge portion of the flexible display substrate.

According to one or more embodiments, the unit deformable portions may be holes which are surrounded by the bending area.

According to one or more embodiments, the plurality of unit deformable portions may be spaced apart from each other in a direction of the bending area.

According to one or more embodiments, a first bending line may be on the flexible display substrate such that the flexible display panel is adapted to be folded in the first direction of the flexible display panel about the first bending line.

According to one or more embodiments, a second bending line may cross at least some of the unit deformable portions of the flexible display substrate such that the flexible display panel is foldable or adapted to be folded in the second direction about the second bending line.

According to one or more embodiments, the unit deformable portions may be in a plurality of rows in the bending area. A first bending line may cross one of the plurality of rows of the unit deformable portions. The unit deformable portions may be adjacent to the active area such that the flexible display panel is adapted to be folded in the first direction of the flexible display panel about the first bending line.

According to one or more embodiments, an interval between one or more adjacent unit deformable portions of the plurality of unit deformable portions may be uniform or non-uniform. The shapes of the respective unit deformable portions may be the same or different from each other.

According to one or more embodiments, the functional layer may include a first surface facing the flexible display panel, a second surface opposite to the first surface, and a groove on the second surface. The flexible display panel may pass by a side surface of the functional layer (e.g., without directly contacting the side surface) and may include an end portion which is on the groove of the functional layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

The one or more embodiments described herein may have different forms and should not be construed as being limited to the descriptions set forth herein. Rather, these embodiments are provided as examples so that this disclosure will be thorough and complete, and will fully convey the aspects and features of its subject matter to those skilled in the art. Accordingly, processes, elements, and techniques that are not necessary to those having ordinary skill in the art for a complete understanding of the aspects and features of the technology disclosed herein may not be described. In the drawings, the relative sizes of elements, layers, and regions may be exaggerated for clarity.

It will be understood that although the terms "first", "second", etc., may be used herein to describe various elements, components, regions, layers, and/or sections, these elements, components, regions, layers, and/or sections should not be limited by these terms. These components are used to distinguish one element, component, region, layer, or section from another element, component, region, layer, or section. Thus, a first element, component, region, layer or section described below could be termed a second element, component, region, layer or section, without departing from the spirit and scope of this disclosure.

Spatially relative terms, such as "beneath," "below," "lower," "under," "above," "upper," "horizontal," "vertical," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising" used herein specify the presence of stated features or components, for example, characteristics, numbers, steps, operations, elements, parts, or a combination thereof, but do not preclude the presence or addition of one or more other features or components, for example, characteristics, numbers, steps, operations, elements, parts, or a combination thereof.

As used herein, the use of "may" refers to "in one or more embodiments." As used herein, the terms "use," "using," and "used" may be considered synonymous with the terms "utilize," "utilizing," and "utilized," respectively. Also, the term "exemplary" is intended to refer to an example or illustration. As used herein, the term "and/or" includes any and all combinations of one or more of the associated listed items. Expressions such as "at least one of," when preceding a list of elements, modify the entire list of elements and do not modify the individual elements of the list.

The electronic or electric devices and/or any other relevant devices or components according to one or more embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Reference will now be made in detail to one or more embodiments of a flexible display apparatus, examples of which are illustrated in the accompanying drawings, wherein like reference numerals refer to like elements throughout.

Figure 1:
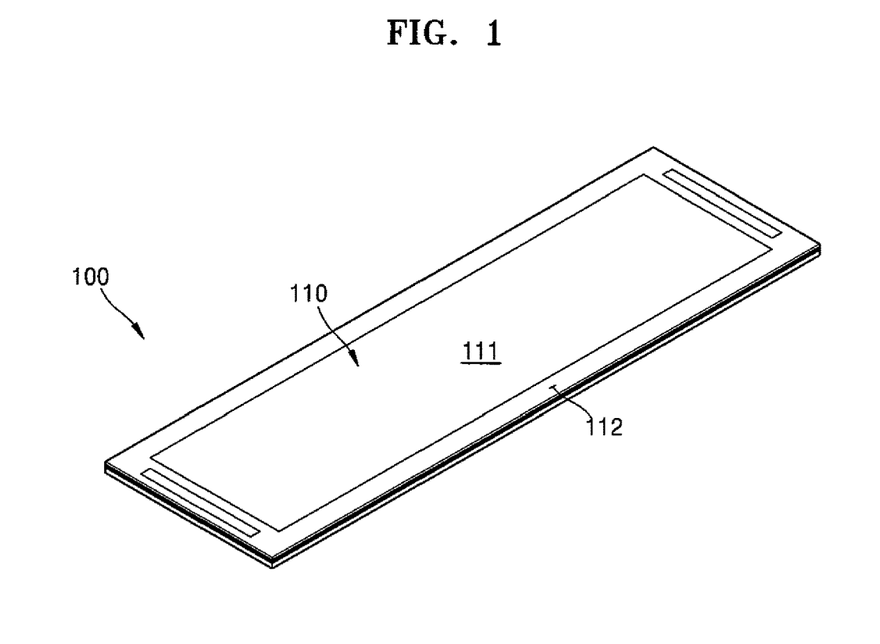
FIG. 1 is a perspective view illustrating a spread state of a flexible display apparatus according to one or more embodiments of the present inventive concept.
Figure 2:
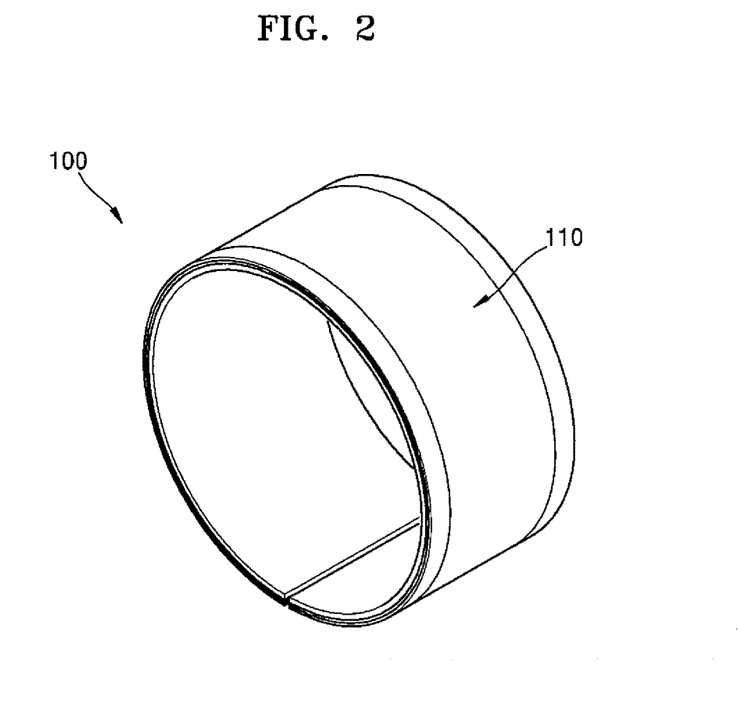
FIG. 2 is a perspective view illustrating a rolled state of the flexible display apparatus of FIG. 1.

FIG. 1 is a perspective view illustrating a spread state of a flexible display apparatus 100 according to one or more embodiments, and FIG. 2 is a perspective view illustrating a rolled state of the flexible display apparatus 100 of FIG. 1.

Referring to FIGS. 1 and 2, the flexible display apparatus 100 includes a flexible display substrate 110. The flexible display substrate 110 has or includes an active area (AA) 111 adapted to display an image and an inactive area (IAA) 112 outside the active area 111. The inactive area 112 extends from the active area 111.

The flexible display substrate 110 includes a flexible display substrate and may include various functional films, such as a touch screen, a polarizer, and a cover window.

The flexible display apparatus 100 may display the image from various angles in a spread state, a curved state; and a rolled-up or hollow cylinder state of the flexible display apparatus 100.

Figure 3:
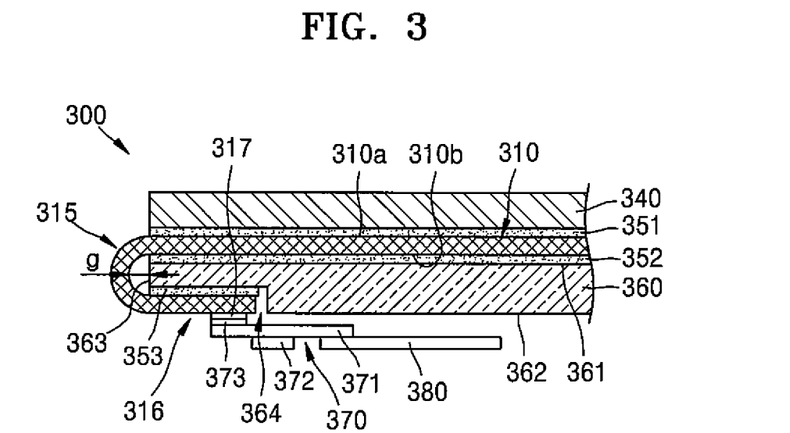
FIG. 3 is a cross-sectional view illustrating a portion of a flexible display apparatus according to one or more embodiments of the present inventive concept.

FIG. 3 is a cross-sectional view illustrating a portion of a flexible display apparatus 300 according to one or more embodiments.

In one or more embodiments, the flexible display apparatus 300 described below may be an organic light-emitting display device as an example. However, the flexible display apparatus 300 may be a liquid crystal display (LCD), a field emission display (FED), an electronic paper display (EDP), or any other suitable type of display apparatus.

In one or more embodiments, the flexible display apparatus 300 may include a flexible display substrate, at least one thin-film transistor (TFT) on the flexible display substrate, at least one light-emitting element connected to the TFT, and an encapsulation layer on the flexible display substrate.

Referring to FIG. 3, in one or more embodiments the flexible display apparatus 300 may include a flexible display panel 310.

The flexible display panel 310 includes a first surface 310a to display an image and a second surface 310b that is opposite to the first surface 310a. The flexible display panel 310 may include a bending area 315 that is foldable or adapted to be folded in one direction.

A first functional film 340 may be arranged on the first surface 310a of the flexible display panel 310. In one or more embodiments, the first functional film (or first functional layer) 340 may include one or more of various films such as a polarizer, a touch screen, and a cover window.

An adhesive layer 351 may be between the flexible display panel 310 and the first functional film 340.

A second functional film (or second functional layer) 360 may be on the second surface 310b of the flexible display panel 310. In one or more embodiments, the second functional film 360 may include one or more of a black layer adapted to absorb light, a cushion layer adapted to absorb shock, a heat discharge layer adapted to discharge heat, and/or an antenna layer. In one or more embodiments, the second functional film 360 may include a layer having one or more of various functions.

The second functional film 360 may include a first surface 361 facing the flexible display panel 310, and a second surface 362 that is opposite to the first surface 361. A groove 364 may be formed in the second surface 362. The groove 364 may be recessed from the second surface 362. The flexible display panel 310 may be in the groove 364 through a side surface 363 of the second functional film 360. An end portion 316 of the flexible display panel 310 may be fixed to the groove 364 by using an adhesive layer 353.

In one or more embodiments, the second functional film 360 may not include the groove 364, and the end portion 316 of the flexible display panel 310 may be on the second surface 362 of the second functional film 360.

In one or more embodiments, there may be a gap "g" between the bending area 315 of the flexible display panel 310 and the side surface 363 of the second functional film 360. The gap "g" may be filled partially or completely with air.

In one or more embodiments, there may not be a gap "g" between the bending area 315 of the flexible display panel 310 and the side surface 363 of the second functional film 360. The side surface 363 of the second functional film 360 may extend to and contact an inside surface of the flexible display panel 310.

In one or more embodiments, the gap "g" may be filled with resin or another material.

A driving unit (or driver) 370 may be arranged below the second functional film 360. The driving unit 370 may be electrically connected to the flexible display panel 310. The driving unit 370 may include a driving circuit and may have a chip on film (COF) structure.

The driving unit 370 includes a flexible film 371, a driving integrated circuit (IC) 372 on the flexible film 371, and one or more driving terminals 373 on an end of the flexible film 371. The driving terminals 373 may be electrically connected to one or more pad terminals 317. The one or more pad terminals 317 may be on the end portion 316 of the flexible display panel 310.

The driving unit 370 may be electrically connected to a circuit board 380. The circuit board 380 may be a printed circuit board. The circuit board 380 may be, for example, a flexible printed circuit board (FPCB).

An adhesive layer 352 may be between the flexible display panel 310 and the second functional film 360. The adhesive layer 352 may be a thick polymer film and may be adapted to support the flexible display panel 310.

In one or more embodiments, in order to simplify a process of manufacturing the flexible display apparatus 300, the adhesive layer 352 may be a thin film of an optical-clear adhesive (OCA) or any other suitable adhesive material.

Figure 4:
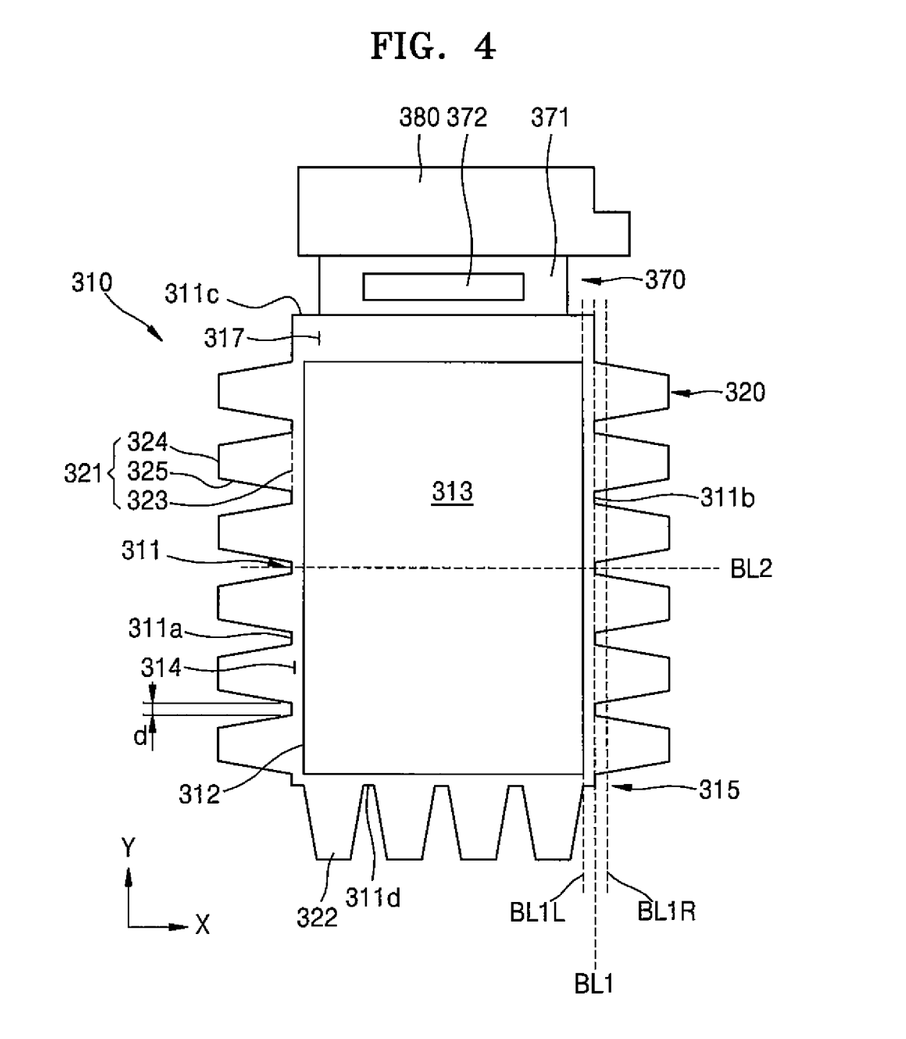
FIG. 4 is a plan view illustrating a flexible display panel of the flexible display apparatus of FIG. 3 before being folded.
Figure 5A:
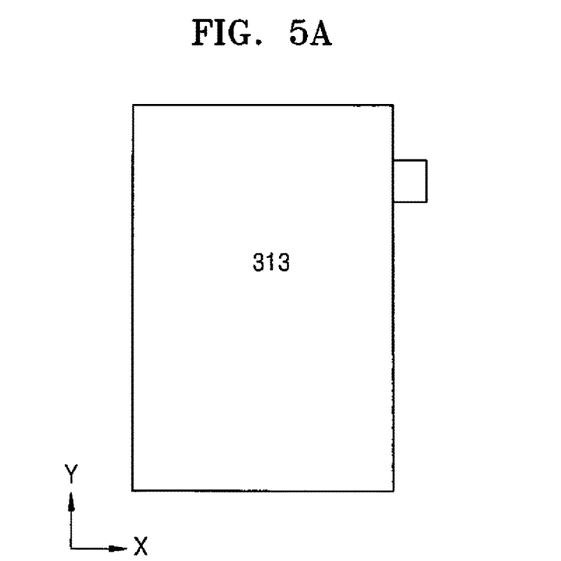
FIG. 5A is a plan view illustrating a front side of the flexible display panel of FIG. 4 after being folded.
Figure 5B:
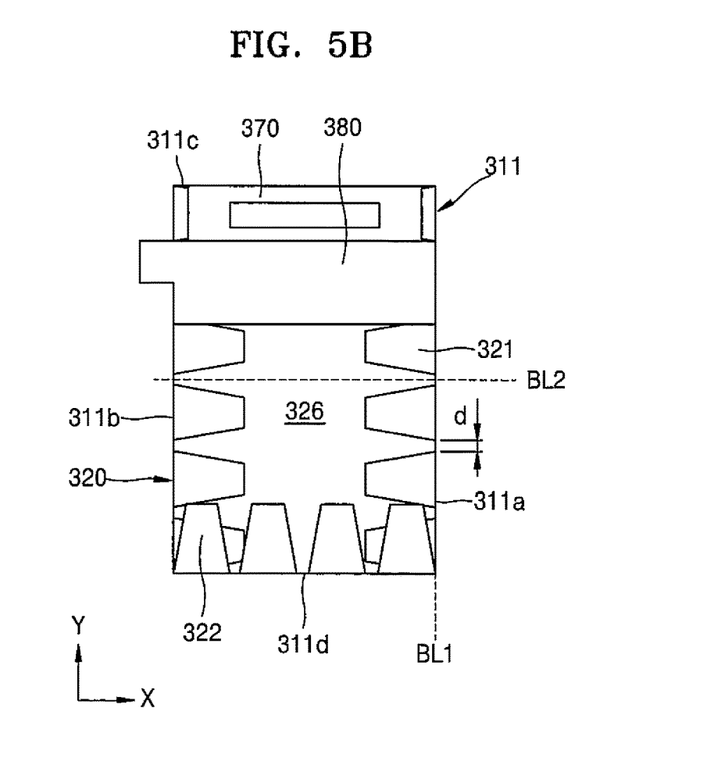
FIG. 5B is a rear view illustrating a rear side of the flexible display panel of FIG. 5A.
Figure 6:
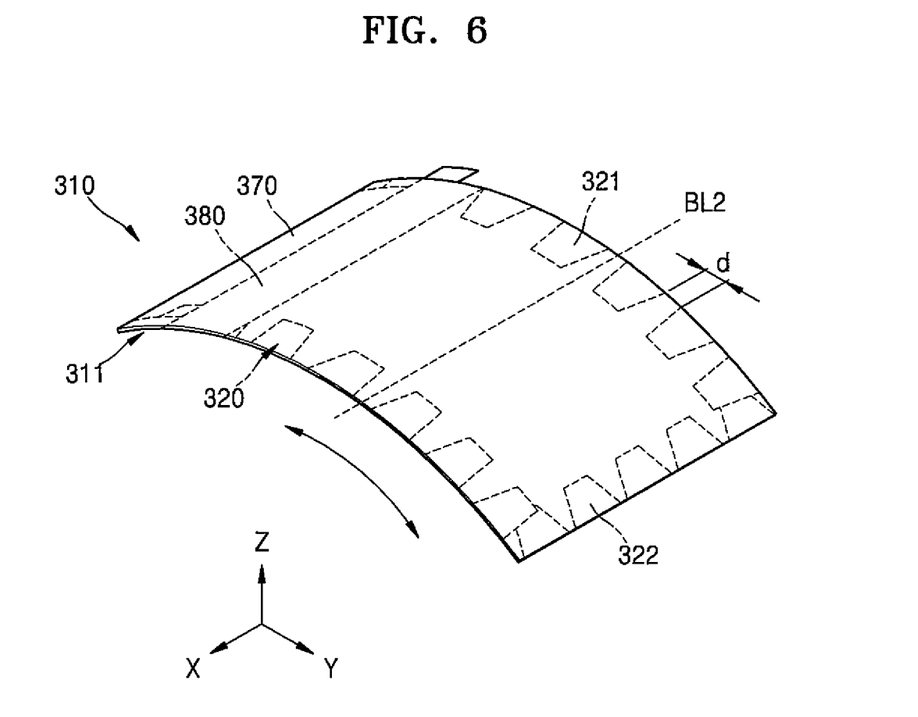
FIG. 6 is a perspective view illustrating an additionally folded state of the flexible display panel of FIG. 4.

FIG. 4 is a plan view illustrating the flexible display panel 310 of FIG. 3 before being folded. FIG. 5A is a plan view illustrating a front side of the flexible display panel 310 of FIG. 4 after being folded. FIG. 5B is a rear view illustrating a rear side 326 of the flexible display panel 310 of FIG. 5A. FIG. 6 is a perspective view illustrating an additionally folded state of the flexible display panel 310 of FIG. 4.

Referring to FIGS. 4, 5A, 5B, and 6, the flexible display panel 310 may include a flexible display substrate 311 having a plurality of elements. An encapsulation layer 312 may be on the flexible display substrate 311. In one or more embodiments, the encapsulation layer 312 may be a thin film encapsulation (TFE) layer.

The flexible display substrate 311 has or includes an active area 313 adapted to display an image and an inactive area 314 outside the active area 313. The inactive area 314 extends from the active area 313.

The encapsulation layer 312 may cover the active area 313.

The inactive area 314 may surround the active area 313. The inactive-area 314 may include a bending area 315 in which the flexible display substrate 311 is adapted to be bent in a first direction. The first direction may correspond to a horizontal direction. The horizontal direction may include a width direction (an X direction as indicated by the axes provided in FIGS. 4, 5A, 5B, and 6) or a longitudinal direction (a Y direction as indicated by the axes provided in FIGS. 4, 5A, 5B, and 6).

The flexible display substrate 311 includes a first edge portion 311a and a second edge portion 311b, which are arranged to face each other in the X direction, and a third edge portion 311c and a fourth edge portion 311d, which are arranged to face each other in the Y direction. At least one of the first edge portion 311a, the second edge portion 311b, the third edge portion 311c, and the fourth edge portion 311d in the bending area 315 may be bendable or adapted to be bent.

The bending area 315 may include a deformation unit 320 having a plurality of unit deformable portions 321 and 322 such that the flexible display substrate 311 may be folded (e.g., foldable or adapted to be folded) in a second direction. The second direction may correspond to a vertical direction including a Z direction as indicated by the axes provided in FIG. 6 in which the flexible display panel 310 is adapted to be bent.

The deformation unit 320 may be arranged along at least one of the first edge portion 311a, the second edge portion 311b, the third edge portion 311c, and the fourth edge portion 311d of the flexible display substrate 311. In one or more embodiments, at least one of the deformation units 320 may be on each of the first edge portion 311a, the second edge portion 311b, and the fourth edge portion 311d.

The deformation unit 320 may be formed by cutting out at least a portion of the bending area 315. In detail, unit deformable portions of the deformation unit 320 may include a plurality of first unit deformable portions 321, which are arranged along the first edge portion 311a and the second edge portion 311b of the flexible display substrate 311. The first unit deformable portions 321 may be referred to or configured as a plurality of wing portions of the flexible display substrate 311. Unit deformable portions of the deformation unit 320 may further include a plurality of second unit deformable portions 322, which are arranged along the fourth edge portion 311d of the flexible display substrate 311 and are referred to or configured as the plurality of wing portions of the flexible display substrate 311.

In one or more embodiments, the first unit deformable portions 321 may include a bottom portion 323, which is in contact with the first edge portion 311a of the flexible display substrate 311, a top portion 324 positioned away from the first edge portion 311a of the flexible display substrate 311, and a side portion 325 connecting the bottom portion 323 and the top portion 324 to each other. The bottom portion 323, the top portion 324, and the side portion 325 may correspond to a cut portion of the bending area 315 formed by cutting off one or more areas of the bending area 315. The cut portion of the bending area 315 may be a single-cut portion of the bending area 315 or a multi-cut portion of the bending area 315. In one or more embodiments, the bottom portion 323, the top portion 324, and the side portion 325 may correspond to a three-cut portion of the bending area 315 as illustrated in FIG. 4.

The first unit deformable portions 321 may become narrower as a distance from the bottom portion 323 contacting the first edge portion 311a of the flexible display substrate 311 increases. In one or more embodiments, the deformation unit 320 may have a shape of a trapezoid as illustrated in FIG. 4. In one or more embodiments, the deformation unit 320 may have a suitable geometric shape other than a trapezoid.

In one or more embodiments, the second unit deformable portions 322 may have the same shape as the first unit deformable portions 321. In one or more embodiments, the second unit deformable portions 322 may have a different shape than the first unit deformable portions 321.

A first bending line BL1 may extend partially or completely along a boundary between the deformation unit 320 and the respective first, second, and fourth edge portions 311a, 311b, and 311d of the flexible display substrate 311. As used herein according to one or more embodiments, the term "line" should be understood as referring to a visible or invisible axis. The first bending line BL1 may be arranged in the longitudinal direction (Y direction as indicated by the axes provided in FIGS. 4, 5A, 5B, and 6) of the flexible display panel 310. The flexible display substrate 311 may be folded (e.g., foldable or adapted to be folded) with respect to the first bending line BL1.

In one or more embodiments, the first bending line BL1 may be movable by a distance (e.g., a predetermined distance) to a left bending line BL1L or a right bending line BL1R according to an assembling tolerance, as illustrated in FIG. 4.

In one or more embodiments, the third edge portion 311c of the flexible display substrate 311, on which the driving unit 370 is arranged, may be foldable or adapted to be folded.

The flexible display substrate 311 may be foldable or adapted to be folded along a second bending line BL2. The second bending line BL2 may extend through the deformation unit 320 of the flexible display substrate 311. The second bending line BL2 may be in an interval "d" between one or more adjacent first unit deformable portions of the first unit deformable portions 321 along the first edge portion 311a or along the second edge portion 311b of the flexible display substrate 311. The second bending line BL2 may be in the X direction of the flexible display panel 310.

The second bending line BL2 may be between one or more of adjacent first unit deformable portions of the first unit deformable portions 321. The flexible display substrate 311 may be folded (e.g., foldable or adapted to be folded) in the second direction with respect to the second bending line BL2.

In one or more embodiments, the second bending line BL2 may also be between one or more adjacent second unit deformable portions of the second unit deformable portions 322 along the fourth edge portion 311d of the flexible display substrate 311.

In one or more embodiments, the active area 313 may be extended to the deformation unit 320 to reduce a size of a bezel of the flexible display panel 310. When the bending area 315 foldable or adapted to be folded in the first direction is, in operation, folded in the first direction, the active area 313 may be on an upper side of the flexible display panel 310 and a side of the flexible display panel 310 with respect to the folded configuration of the flexible display panel 310.

In one or more embodiments, one or more deformation units 320 may include wires (not illustrated) extending from the active area 313.

The flexible display panel 310 may be foldable or adapted to be folded at least once in each of the horizontal direction and the vertical direction. In one or more embodiments, the flexible display panel 310 may be foldable or adapted to be folded at least twice in each of the horizontal direction and the vertical direction. In one or more embodiments, the flexible display panel 310 may be foldable or adapted to be folded in the horizontal direction once and in the vertical direction once.

The above folding process will be further explained in detail.

As illustrated in FIGS. 4, 5A, and 5B, the flexible display panel 310 that is foldable or adapted to be folded about the first bending line BL1 may, in operation, be folded about the first bending line BL1 in the first direction. The bending area 315 may be folded at the first edge portion 311a, the second edge portion 311b, the third edge portion 311c, and the fourth edge portion 311d in the X direction and the Y direction of the flexible display panel 310.

When the flexible display panel 310 is folded in the first direction, the deformation unit 320 having the unit deformable portions 321 and 322 may be folded to a rear side 326 of the flexible display panel 310, as illustrated in FIG. 5B. The driving unit 370 and the circuit board 380, which may be electrically connected to the driving unit 370, may also be folded to the rear side 326 of the flexible display panel 310.

Accordingly, the flexible display panel may have a structure with a reduced or minimized bezel, as illustrated in FIG. 5A.

As illustrated in FIG. 6, the flexible display panel 310 may be additionally folded about the second bending line BL2. The flexible display panel 310 may be folded in the second direction (the Z direction as indicated by the axes provided in FIG. 6). As discussed elsewhere herein, the second direction may be perpendicular to the first direction (e.g., the X direction and/or the Y direction as indicated by the axes provided in FIG. 6).

In one or more embodiments, because the plurality of unit deformable portions 321 and 322 are along one or more of the first edge portion 311a, the second edge portion 311b, the third edge portion 311c, and the fourth edge portion 311d and are spaced apart from each other as illustrated, for example, by interval "d" of FIG. 4, the flexible display panel 310 may be folded in various angles.

As such, the flexible display panel 310 may be foldable or adapted to be folded about the first bending line BL1 and may be additionally foldable or adapted to be folded about the second bending line BL2.

In one or more embodiments, the deformation unit 320 may have various shapes.

Figure 8A:
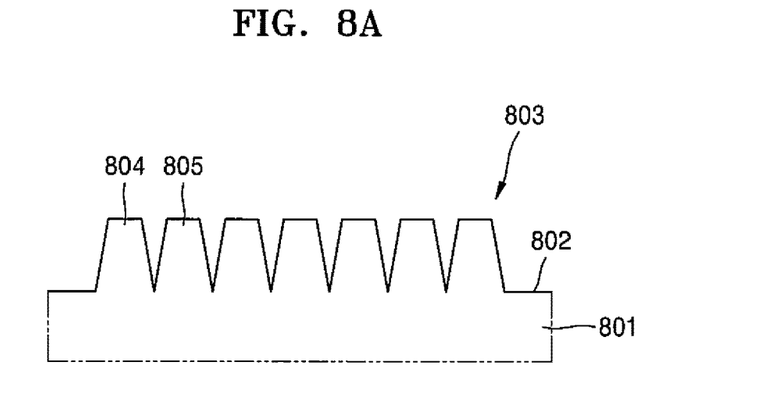
FIGS. 8A through 8C are plan views illustrating modifications of the flexible display panel of FIG. 4 according to one or more embodiments of the present inventive concept.

For example, as illustrated in FIG. 8A, a deformation unit 803 may protrude from an edge portion 802 of a flexible display substrate 801. The deformation unit 803 may include a plurality of unit deformable portions 804 and 805 which have the same shape. In one or more embodiments, the deformation unit 803 may not include an interval between one or more of the adjacent unit deformable portions 804 and 805, the adjacent unit deformable portions 804 and 805 may not be spaced apart from each other, and at least portions of the adjacent unit deformable portions 804 and 805 may contact each other.

Figure 8B:
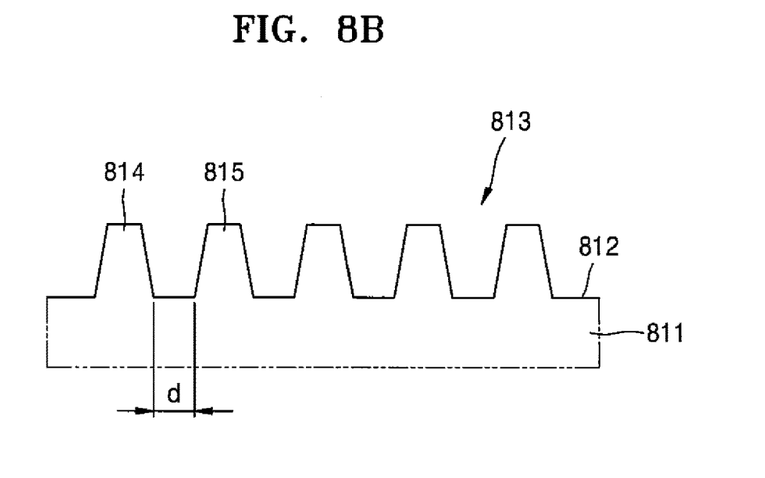

As illustrated in FIG. 8B, a deformation unit 813 may protrude from an edge portion 812 of a flexible display substrate 811. The deformation unit 813 may include a plurality of unit deformable portions 814 and 815. In one or more embodiments, the deformation unit 813 may include an interval "d" between one or more of the adjacent unit deformable portions 814 and 815. In one or more embodiments, the adjacent unit deformable portions 814 and 815 may be spaced apart from each other.

Figure 8C:
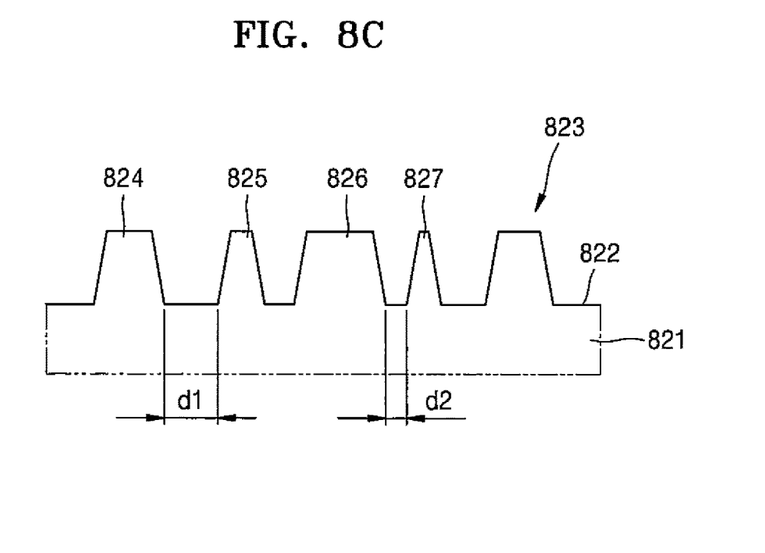

As illustrated in FIG. 8C, a deformation unit 823 may protrude from an edge portion 822 of a flexible display substrate 821. The deformation unit 823 may include a plurality of unit deformable portions 824, 825, 826, and 827. Two or more of the unit deformable portions 824, 825, 826, and 827 may have different shapes. A first interval "d1" between a pair of the adjacent unit deformable portions 824 and 825 may be different from a second interval "d2" between a pair of the adjacent unit deformable portions 826 and 827.

As described above, the deformation units 803, 813, and 823 may have a uniform interval, non-uniform intervals, the same shape, and/or different shapes.

In one or more embodiments, the deformation units 803, 813, and 823 may have various shapes such as a circle, an ellipse, a square, a rectangle, a polygon, a zigzag shape, and/or another suitable geometric shape.

Figure 7:
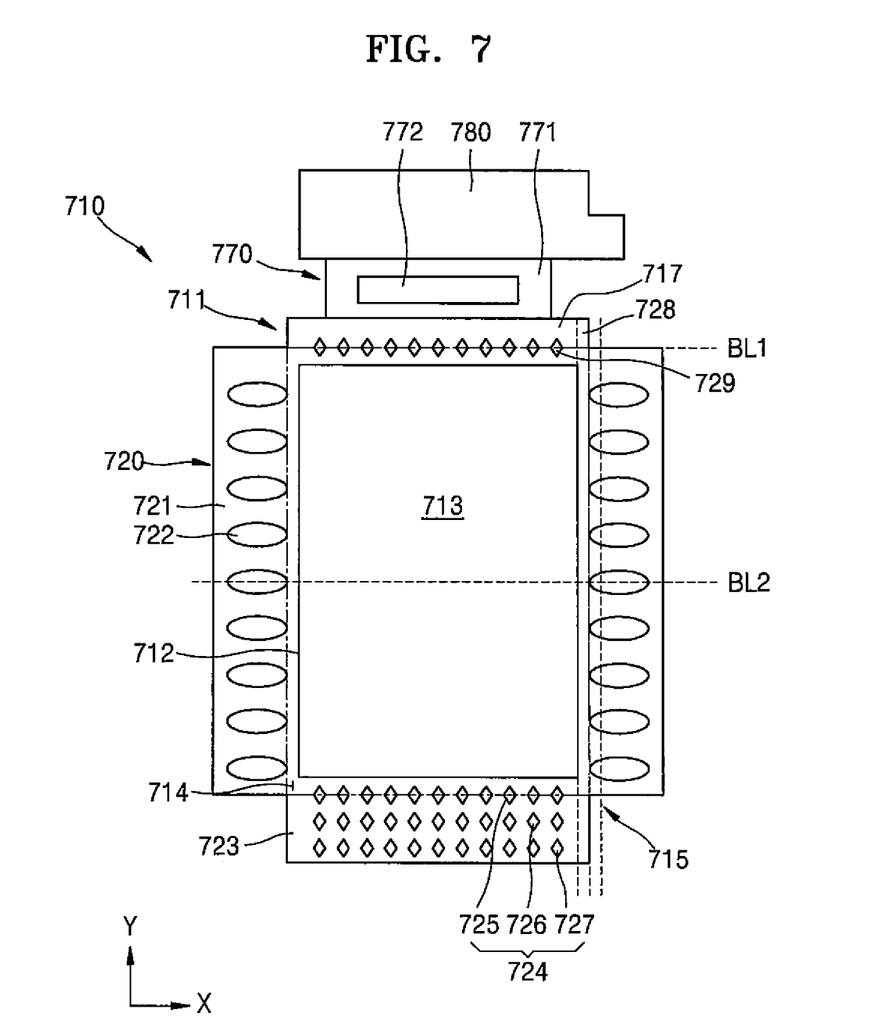
FIG. 7 is a plan view illustrating a flexible display panel that is foldable or adapted to be folded according to one or more embodiments before being folded according to one or more embodiments of the present inventive concept.

FIG. 7 is a plan view illustrating a flexible display panel 710 that is foldable or adapted to be folded according to one or more embodiments before being folded.

Referring to FIG. 7, the flexible display panel 710 includes a flexible display substrate 711 and an encapsulation layer 712 arranged on the flexible display substrate 711.

The flexible display substrate 711 has or includes an active area 713 which may be adapted to display an image, and an inactive area 714 outside the active area 713. The inactive area 714 extends from the active area 713.

The inactive area 714 may surround (e.g., surround in a plane) the active area 713. The inactive area 714 may include a bending area 715 in which the flexible display substrate 711 is adapted to fold in at least a first direction. Reference to the bending area 715 may be made by reference to particular regions of the bending area 715, such as a side bending area 721, a lower bending area 723, an upper bending area 728, or other bending areas. As used herein, a reference to features or characteristics of the bending area 715 applies to other bending areas, and vice versa. The first direction may correspond to a horizontal direction of the flexible display substrate 711. The horizontal direction may include a width direction (an X direction as indicated by the axes provided in FIG. 7) or a longitudinal direction (a Y direction as indicated by the axes provided in FIG. 7).

The bending area 715 may include a deformation unit 720 having a plurality of unit deformable portions 722, 724, and 729 such that the flexible display substrate 711 is adapted to be easily folded in a second direction. The second direction may correspond to a vertical direction of the flexible display substrate 711. The vertical direction may be perpendicular to the horizontal direction.

At least a portion of the bending area 715 is cut out in the deformation unit 720.

The plurality of unit deformable portions 722, 724, and 729 may correspond to a plurality of holes arranged in the bending area 715 which is extended along an edge portion of the flexible display substrate 711. The plurality of unit deformable portions 722, 724, and 729 may be holes or openings which are surrounded by the bending area 715.

Within each respective plurality of unit deformable portions 722, 724, and 729, the unit deformable portions may be spaced apart from each other in any direction of the bending area 715, that is, in the X direction as illustrated in the upper bending area 728, in the Y direction as illustrated in the side bending area 721, or in both the X and Y direction as illustrated in the lower bending area 723.

The flexible display substrate 711 may include a first bending line BL1 along an edge portion of the bending area 715 in which the deformation unit 720 is arranged. The flexible display substrate 711 may be adapted to bend at the first bending line BL1. Although FIG. 7 shows a single instance of first bending line BL1 for illustrative purposes, it should be understand that an instance of the first bending line BL1 may be present in the bending area 715 along any or all of the edge portions of the flexible display substrate 711. For example, the first bending line BL1 may extend in a width direction of the flexible display substrate (an X direction as indicated by the axes provided in FIG. 7) as shown in FIG. 7, or the first bending line BL1 may extend in a longitudinal direction (a Y direction as indicated by the axes provided in FIG. 7) of the flexible display substrate 711 as illustrated by the first bending line BL1 in FIG. 4. According to the embodiment illustrated in FIG. 7, the flexible display substrate 711 is foldable in the first direction about the first bending line BL1.

In one or more embodiments, the unit deformable portions 724 may be arranged in plural rows in the bending area 715. The unit deformable portions 724, which may be arranged in a lower bending area 723 of the flexible display substrate 711, may include a plurality of first unit deformable portions 725 adjacent to (e.g., arranged at the closest position to or immediately adjacent to) the active area 713. The unit deformable portions 724 may include a plurality of second unit deformable portions 726 below the first unit deformable portions 725. The unit deformable portions 724 may include a plurality of third unit deformable portions 727 arranged below the second unit deformable portions 726. Among the first unit deformable portions 725, the second unit deformable portions 726, and the third unit deformable portions 727, the first unit deformable portions 725 may be the closest to the active area 713, the second unit deformable portions 726 may be second closest to the active area 713, and the third unit deformable portions 727 may be the third closest to the active area 713. The plurality of first unit deformable portions 725, the plurality of second unit deformable portions 726, or the plurality of third unit deformable portions 727 are spaced apart from each other in the X direction. The plurality of first unit deformable portions 725, the plurality of second unit deformable portions 726, and the plurality of third unit deformable portions 727 are spaced apart from each other in the Y direction which intersects the X direction.

In order to reduce or minimize a bezel of the flexible display panel 710, the first bending line BL1 may cross a line of the first unit deformable portions 725. The first unit deformable portions 725 may be closest to the active area 713 and may be adapted to be folded in the first direction.

In one or more embodiments, the first bending line BL1 may be arranged to cross a line of the unit deformable portions 729. The unit deformable portions 729 may be in an upper bending area 728 of the flexible display substrate 711 and are spaced apart from each other (for example, in the X direction as shown in FIG. 7) so that the flexible display substrate 711 is adapted to be folded in the first direction about the first bending line BL1.

A driving unit (or driver) 770, which includes a driving integrated circuit (IC) 772 on a flexible film 771, and a circuit board 780 may be on or coupled to the upper bending area 728 of the flexible display substrate 711. The circuit board 780 may be electrically connected to the driving unit 770. Bendability of the flexible display substrate 711 may be improved by patterning the unit deformable portions 729 not to overlap a plurality of wires (not illustrated) in the upper bending area 728.

A second bending line BL2 may cross an active area 713 and a plurality of unit deformable portions 722. The flexible display substrate 711 may be adapted to bend in a second direction about the second bending line BL2. The unit deformable portions 722 may be in a side bending area 721 of the flexible display substrate 711. The unit deformable portions 722 may be spaced apart from each other along the Y direction so that the flexible display substrate 711 is adapted to be folded in the second direction about the second bending line BL2. In one or more embodiments, when the flexible display substrate 711 is, in operation, folded in the vertical direction, stress may be reduced or mitigated because the plurality of unit deformable portions 722 are arranged on both sides of the flexible display substrate 711 in a width or X direction of the flexible display substrate 711.

As such, the flexible display panel 710 may be foldable or adapted to be folded about the first bending line BL1 and additionally folded about the second bending line BL2.

In one or more embodiments, the active area 713 may be extended to the bending area 715 in which the deformation unit 720 is disposed so that the bezel of the flexible display panel 710 is reduced or minimized. When the bending area 715 is folded in the first direction, the active area 713 may be additionally be on a side of the flexible display panel 710 with respect to the then-folded configuration of the flexible display panel 710.

In one or more embodiments, the bending area 715 in which the deformation unit 720 is disposed may include wires (not illustrated) which extend from the active area 713.

In one or more embodiments, the deformation unit 720 may include various shapes.

Figure 9A:
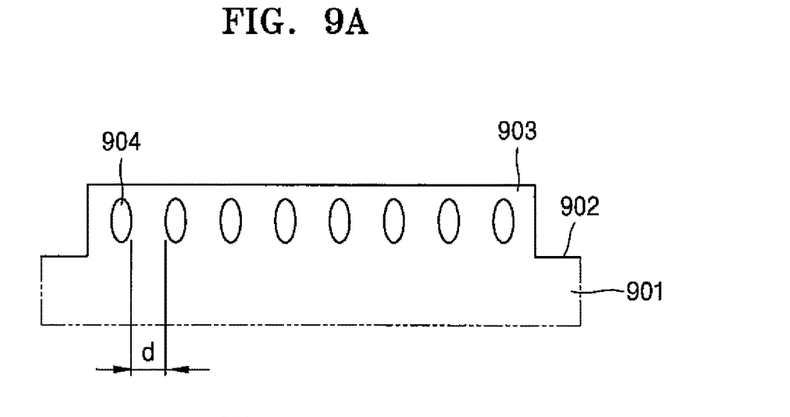
FIGS. 9A through 9C are plan views illustrating modifications of the flexible display panel of FIG. 7 according to one or more embodiments of the present inventive concept.

For example, as illustrated in FIG. 9A, deformation units 904 may be arranged in a bending area 903 which is extended from an edge portion 902 of a flexible display substrate 901. One or more of the deformation units 904 may have a same shape. One or more adjacent deformation units of deformation units 904 may be spaced apart from one another by an interval "d" between the adjacent deformation units 904.

Figure 9B:
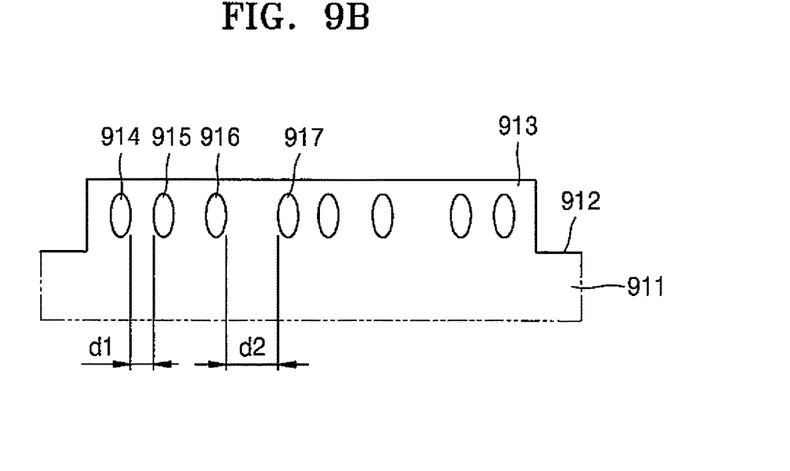

As illustrated in FIG. 9B, deformation units 914 through 917 may be arranged in a bending area 913. The bending area 913 which is extended from an edge portion 912 of a flexible display substrate 911. One or more of the deformation units 914 through 917 may have a same shape. An interval "d1" between the adjacent deformation units 914 and 915 may be different from an interval "d2" between the adjacent deformation units 916 and 917. In one or more embodiments, the interval d1 and the interval d2 may be the same.

Figure 9C:
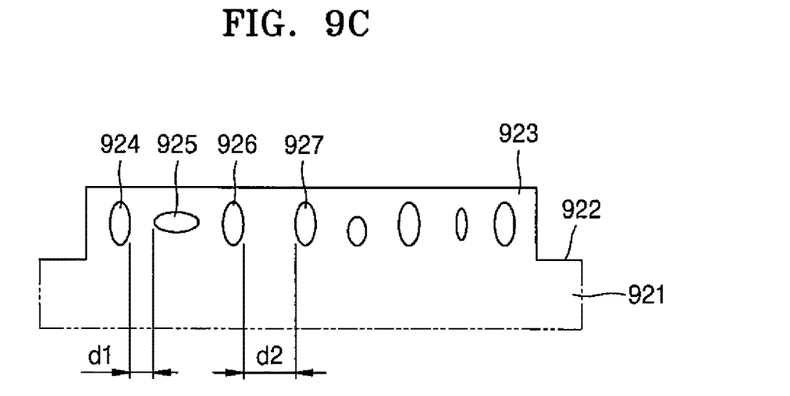

As illustrated in FIG. 9C, deformation units 924 through 927 may be arranged in a bending area 923. Bending area 923 which is extended from an edge portion 922 of a flexible display substrate 921. Shapes of one or more of the deformation units 924 through 927 may be different from each other. An interval "d1" between the adjacent deformation units 924 and 925 may be different from an interval "d2" between the adjacent deformation units 926 and 927. In one or more embodiments, the interval d1 and the interval d2 may be the same.

As such, the deformation units 904, 914 through 917, and 924 through 927, as respectively illustrated in FIGS. 9A, 9B, and 9C, may have the same interval, different intervals, the same shape, or different shapes.

In one or more embodiments, the deformation units 904, 914 through 917, and 924 through 927 may include at least one of various shapes, such as a circle, an ellipse, a square, a rectangle, a rhombus, a polygon, a zigzag shape, or another suitable geometric shape.

Figure 10:
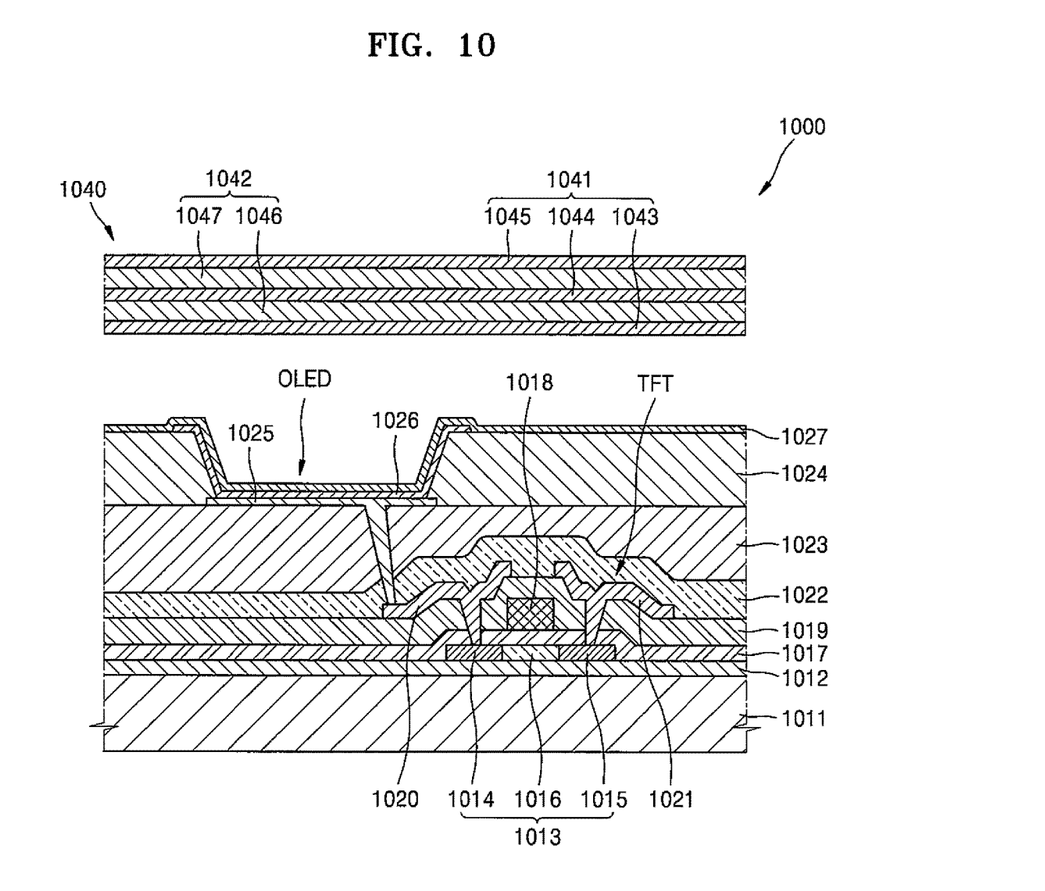
FIG. 10 is a cross-sectional view illustrating a sub-pixel of an organic light-emitting display apparatus according to one or more embodiments of the present inventive concept.

FIG. 10 is a cross-sectional view illustrating a sub-pixel of an organic light-emitting display apparatus 1000 according to one or more embodiments.

In one or more embodiments, the sub-pixel may include at least one thin film transistor (TFT) and at least one organic light-emitting device (OLED). The thin film transistor TFT is not limited to a structure illustrated in FIG. 10, but may be variable in number and structure.

Referring to FIG. 10, the OLED apparatus 1000 may include a display substrate 1011 and an encapsulation layer 1040 on the display substrate 1011.

The display substrate 1011 may be a flexible glass substrate or a flexible polymer substrate. The display substrate 1011 may be transparent, semi-transparent, or translucent.

A buffer film 1012 may be on the display substrate 1011. The buffer film 1012 may partially or entirely cover an upper surface of the display substrate 1011. The buffer film 1012 may include an inorganic film or an organic film. The buffer film 1012 may be a single-layer film or a multi-layer film.

The TFT may be on the buffer film 1012. Although the TFT may be referred to herein as a top gate transistor in reference to one or more embodiments, the TFT is not limited to a top gate transistor. The TFT may include a bottom gate transistor or various other TFTs.

A semiconductor active layer 1013 may be on the buffer film 1012.

The semiconductor active layer 1013 may include a source region 1014 and a drain region 1015. The source region 1014 and the drain region 1015 may be formed by doping the semiconductor active layer 1013 with N-type impurity ions or P-type impurity ions. A channel region 1016 may be disposed between the source region 1014 and the drain region 1015 without doping with impurities. The semiconductor active layer 1013 may include an organic semiconductor, an inorganic semiconductor, or amorphous silicon. In one or more embodiments, the semiconductor active layer 1013 may include a metal oxide semiconductor.

A gate insulation film 1017 may be on the semiconductor active layer 1013. The gate insulation film 1017 may include an inorganic film. The gate insulation film 1017 may include a single-layer film or a multi-layer film.

A gate electrode 1018 may be formed on the gate insulation film 1017. The gate electrode 1018 may include a metal element with excellent conductivity. The gate electrode 1018 may include a single-layer film or a multi-layer film.

An interlayer insulation film 1019 may be on the gate electrode 1018. The interlayer insulation film 1019 may include a single-layer film or a multi-layer film.

A source electrode 1020 and a drain electrode 1021 may be on the interlayer insulation film 1019. Contact holes or contact openings may be formed by removing (e.g., partially removing) portions of the gate insulation film 1017 and the interlayer insulation film 1019. The source electrode 1020 may be electrically connected to the source region 1014 through the corresponding contact holes. The drain electrode 1021 may be electrically connected to the drain region 1015 through the corresponding contact holes.

A passivation film 1022 may be on the source electrode 1020 and the drain electrode 1021. The passivation film 1022 may include an inorganic film or an organic film. A planarization film 1023 may be on the passivation film 1022. In one or more embodiments, one of the passivation film 1022 and the planarization film 1023 may be omitted.

The TFT may be electrically connected to the OLED.

The OLED may be on the planarization film 1023. The OLED may include a first electrode 1025, an intermediate layer 1026, and a second electrode 1027.

The first electrode 1025 may function as an anode and may include one or more of various suitable conductive materials. The first electrode 1025 may include a transparent electrode or a reflective electrode. For example, when in one or more embodiments the first electrode 1025 includes the transparent electrode, the first electrode 1025 may include a transparent conductive film. When in one or more embodiments the first electrode 1025 includes the reflective electrode, the first electrode 1025 may include a reflective film and a transparent conductive film on the reflective film.

A pixel defining film 1024 may be on the planarization film 1023. The pixel defining film 1024 may cover at least a portion of the first electrode 1025. The pixel defining film 1024 may define a light-emitting region of the sub-pixel by surrounding an edge of the first electrode 1025. The first electrode 1025 may be patterned in each sub-pixel.

The pixel defining film 1024 may include an organic film or an inorganic film. The pixel defining film 1024 may include a single-layer film or a multi-layer film.

The intermediate layer 1026 may be on a region of the first electrode 1025 which is exposed when a portion of the pixel defining film 1024 is etched. The intermediate layer 1026 may be formed according to a vacuum vapor deposition process.

In one or more embodiments, the intermediate layer 1026 may include an organic emissive layer.

In one or more embodiments, the intermediate layer 1026 may include the organic emissive layer and at least one of a hole injection layer (HIL), a hole transport layer (HTL), an electron transport layer (ETL), an electron injection layer (EIL), and one or more of various other functional layers not limited to those expressly described herein for illustrative purposes.

The second electrode 1027 may be on the intermediate layer 1026.

The second electrode 1027 may function as a cathode. The second electrode 1027 may include a transparent electrode or a reflective electrode. For example, when in one or more embodiments the second electrode 1027 includes the transparent electrode, the first electrode 1025 may include a metal film and a transparent conductive film on the metal film. When in one or more embodiments the second electrode 1025 includes the reflective electrode, the second electrode 1025 may include a metal film.

In one or more embodiments, a plurality of sub-pixels may be on the display substrate 1011. For example, each sub-pixel may realize a red color, a green color, a blue color, a white color, or one or more of various other colors not limited to those expressly described herein for illustrative purposes.

The encapsulation layer 1040 may partially or entirely cover the OLED. The encapsulation layer 1040 may include an inorganic film 1041 and an organic film 1042, which are alternately stacked on the display substrate 1011. For example, the inorganic film 1041 may include a first inorganic film 1043, a second inorganic film 1044, and a third inorganic film 1045. The organic film 1042 may include a first organic film 1046 and a second organic film 1047. The inorganic film 1041 and the organic film 1042 may, in one or more embodiments, be stacked on the display substrate 1011 in a non-alternating configuration.

As described herein, in a flexible display apparatus according to one or more embodiments, a flexible display panel may be folded in various directions.

It should be understood that the one or more embodiments described herein should be considered in a descriptive sense only and not for purposes of limitation. Descriptions of features or aspects within the one or more embodiments should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims and their equivalents.

What is claimed is:

1. A flexible display apparatus comprising:
    a flexible display panel comprising a flexible display substrate and an encapsulation layer on an upper side of the flexible display substrate in a first direction, the flexible display substrate being curved about a second axis extending in a second direction and having an active area and an inactive area extending from a periphery of the active area, the inactive area comprising a plurality of unit deformable portions extending from the active area in the second direction, the first and second direction crossing each other;
    a functional layer on a lower side of the flexible display panel in the first direction, the unit deformable portions extending beyond a periphery of the functional layer in the second direction and being folded about a third axis extending in a third direction to be on a lower side of the functional layer in the first direction, the third direction crossing the first and second directions, the unit deformable portions being both curved about the second axis and folded about the third axis; and
    a driver electrically connected to the flexible display panel,
    wherein the first direction is a vertical direction of the flexible display panel, and the second direction is a horizontal direction of the flexible display panel, and
    wherein the unit deformable portions are arranged along an edge portion of the flexible display substrate and define cut-out portions of the inactive area.

2. The flexible display apparatus of claim 1, wherein the plurality of unit deformable portions are configured as a plurality of wing portions along the edge portion of the flexible display substrate.

3. The flexible display apparatus of claim 2, wherein:
    each of the plurality of unit deformable portions comprises a bottom portion in contact with the edge portion of the flexible display substrate, a top portion away from the edge portion of the flexible display substrate, and a side portion which connects the bottom portion to the top portion; and
    the bottom portion, the top portion, and the side portion are configured as a three-cut portion of the inactive area in which three areas of the inactive area that respectively correspond to the bottom portion, the top portion, and the side portion are cut out.

4. The flexible display apparatus of claim 3, wherein each of the unit deformable portions becomes narrower as a distance from the bottom portion in contact with the edge portion of the flexible display substrate increases.

5. The flexible display apparatus of claim 1, wherein the flexible display substrate is adapted to be folded about the third axis along a first bending line at a boundary between the edge portion of the flexible display substrate and the plurality of unit deformable portions.

6. The flexible display apparatus of claim 5, wherein the flexible display substrate is adapted to be curved about the second axis along a second bending line that crosses the active area of the flexible display substrate between adjacent ones of the unit deformable portions of the plurality of unit deformable portions.

7. The flexible display apparatus of claim 6, wherein the flexible display panel is additionally adapted to be curved along the second bending line, the second direction being perpendicular to the third direction.

8. The flexible display apparatus of claim 1, wherein the plurality of unit deformable portions are spaced apart from each other.

9. The flexible display apparatus of claim 8, wherein adjacent ones of the unit deformable portions of the plurality of unit deformable portions are spaced apart at a uniform interval or a non-uniform interval, and shapes of the unit deformable portions are the same or different from each other.

10. The flexible display apparatus of claim 8, wherein at least portions of adjacent ones of the unit deformable portions of the plurality of unit deformable portions contact each other.

11. The flexible display apparatus of claim 1, wherein the plurality of unit deformable portions define a plurality of openings arranged along the edge portion of the flexible display substrate.

12. The flexible display apparatus of claim 1, wherein the unit deformable portions are openings surrounded by the inactive area of the flexible display substrate.

13. The flexible display apparatus of claim 12, wherein the plurality of unit deformable portions are spaced apart from each other in a longitudinal direction of the flexible display substrate.

14. The flexible display apparatus of claim 13, wherein the flexible display substrate is adapted to be folded about the third axis along a first bending line.

15. The flexible display apparatus of claim 14, wherein the flexible display substrate is adapted to be curved about the second axis along a second bending line that crosses the active area through at least two of the unit deformable portions.

16. The flexible display apparatus of claim 15, wherein the unit deformable portions are adjacent to the active area in a plurality of rows, and the first bending line crosses one of the plurality of rows such that the flexible display panel is adapted to be folded about the third axis along the first bending line.

17. The flexible display apparatus of claim 12, wherein adjacent ones of the unit deformable portions of the plurality of unit deformable portions are spaced apart at a uniform interval or a non-uniform interval, and shapes of the unit deformable portions are the same or different from each other.

18. The flexible display apparatus of claim 1, wherein:
the functional layer comprises a first surface on an underside of the flexible display panel, a second surface opposite to the first surface, and a groove formed in the second surface; and
the flexible display panel extends around a side surface of the functional layer such that an end portion of the flexible display panel is in the groove of the functional layer.

* * * * *